United States Patent
Lin et al.

(10) Patent No.: US 11,086,466 B1
(45) Date of Patent: Aug. 10, 2021

(54) ELECTRONIC DEVICE WITH TOUCH SENSING FUNCTION AND TOUCH SENSING METHOD

(71) Applicant: TPK Touch Solutions (Xiamen) Inc., Fujian (CN)

(72) Inventors: Mingchuan Lin, Taichung (TW); Wenhung Wang, Taichung (TW); Chuan Chih Fu, Taichung (TW); Tai Shih Cheng, Taipei (TW)

(73) Assignee: TPKTouch Solutions (Xiamen) Inc., Xiamen (CN)

( * ) Notice: Subject to any disclaimer, the term of this patent is extended or adjusted under 35 U.S.C. 154(b) by 0 days.

(21) Appl. No.: 16/953,677

(22) Filed: Nov. 20, 2020

(51) Int. Cl.
*G06F 3/044* (2006.01)
*G06F 3/041* (2006.01)
*G02F 1/1333* (2006.01)
*H01L 27/32* (2006.01)

(52) U.S. Cl.
CPC .......... *G06F 3/0448* (2019.05); *G06F 3/0412* (2013.01); *G02F 1/13338* (2013.01); *H01L 27/323* (2013.01)

(58) Field of Classification Search
CPC .. G06F 3/0448; G06F 3/0412; G02F 1/13338; H01L 27/323
See application file for complete search history.

(56) References Cited

U.S. PATENT DOCUMENTS

| | | | | |
|---|---|---|---|---|
| 2007/0279395 | A1* | 12/2007 | Philipp | G06F 3/0448 345/173 |
| 2008/0246496 | A1* | 10/2008 | Hristov | G06F 3/0446 324/686 |
| 2009/0315854 | A1* | 12/2009 | Matsuo | G06F 3/0443 345/174 |
| 2011/0062971 | A1* | 3/2011 | Badaye | G06F 3/0443 324/686 |
| 2011/0279406 | A1* | 11/2011 | Kawaguchi | G06F 3/0443 345/174 |
| 2015/0205410 | A1* | 7/2015 | Cheng | G06F 3/0443 345/174 |

* cited by examiner

*Primary Examiner* — Amit Chatly
(74) *Attorney, Agent, or Firm* — Cooper Legal Group, LLC

(57) ABSTRACT

An electronic device with touch sensing function is provided, which includes multiple touch structures arranged along an X-axis. Each touch structure includes a first electrode, a second electrode, and a third electrode. The first electrode includes an upper-half electrode and a bottom-half electrode coupled with each other. The upper-half electrode and the bottom-half electrode extend toward each other along a Y-axis and are both substantially triangular, and the X-axis is substantially perpendicular to the Y-axis. The second electrode is substantially triangular, and a first side and a second side of the second electrode face the bottom-half electrode and the upper-half electrode, respectively. The third electrode is disposed between the bottom-half electrode and the first side of the second electrode, and the third electrode is substantially strip-shaped.

20 Claims, 9 Drawing Sheets

ELECTRONIC DEVICE WITH TOUCH SENSING FUNCTION AND TOUCH SENSING METHOD

BACKGROUND

Technical Field

The present disclosure generally relates to an electronic device with touch sensing function and touch sensing method thereof. More particularly, the present disclosure relates to an in-cell touch electronic device and touch sensing method thereof.

Description of Related Art

A touch module may be fabricated inside a display with in-cell touch technologies, so that the overall device has the advantages of lightness and high brightness. The common, in-cell touch display on the market performs self-capacitive touch sensing through multiple rectangular touch electrodes arranged inside the in-cell touch display as a matrix, in which each touch electrode needs an independent wire to transmit a sensing result thereof to a touch chip. However, with the increasing demand for touch resolution, the number of channels present in the common touch chip is not enough for this design method, and the touch electrodes are easily short-circuited with each other due to a large number of densely populated wires.

SUMMARY

The disclosure provides an electronic device with touch sensing function and including multiple touch structures arranged along an X-axis. Each touch structure includes a first electrode, a second electrode, and a third electrode. The first electrode includes an upper-half electrode and a bottom-half electrode coupled with each other. The upper-half electrode and the bottom-half electrode extend toward each other along a Y-axis and are both substantially triangular, and the X-axis is substantially perpendicular to the Y-axis. The second electrode is substantially triangular, and a first side and a second side of the second electrode face the bottom-half electrode and the upper-half electrode, respectively. The third electrode is disposed between the bottom-half electrode and the first side of the second electrode, and the third electrode is substantially strip-shaped.

The disclosure provides a touch sensing method suitable for an electronic device with touch sensing function. The electronic device includes multiple touch structures arranged along an X-axis and configured to sense a touch input. The touch sensing method includes the following operations: when capacitance of a first electrode and capacitance a second electrode of one of the multiple touch structures is changed, determining a location, on the X-axis, of the touch input according to a location, on the X-axis, of the one of the multiple touch structures, in which the first electrode includes an upper-half electrode and a bottom-half electrode coupled with each other, the upper-half electrode and the bottom-half electrode extend toward each other along a Y-axis and are both substantially triangular, and the X-axis is substantially perpendicular to the Y-axis, in which the second electrode is substantially triangular, and a first side and a second side of the second electrode face the bottom-half electrode and the upper-half electrode, respectively; when capacitance of a third electrode of the one of the multiple touch structures is changed, determining that a location, on the Y-axis, of the touch input corresponds to the bottom-half electrode, in which the third electrode is disposed between the bottom-half electrode and the first side of the second electrode and is substantially strip-shaped; when the capacitance of the third electrode remains unchanged, determining that the location, on the Y-axis, of the touch input corresponds to the upper-half electrode; in a situation in which the location, on the Y-axis, of the touch input is known to be corresponding to the upper-half electrode or the bottom-half electrode, further determining the location, on the Y-axis, of the touch input according to a capacitance variation of the first electrode and a capacitance variation of the second electrode.

It is to be understood that both the foregoing general description and the following detailed description are by examples and are intended to provide further explanation of the disclosure as claimed.

DETAILED DESCRIPTION

Figure 1:
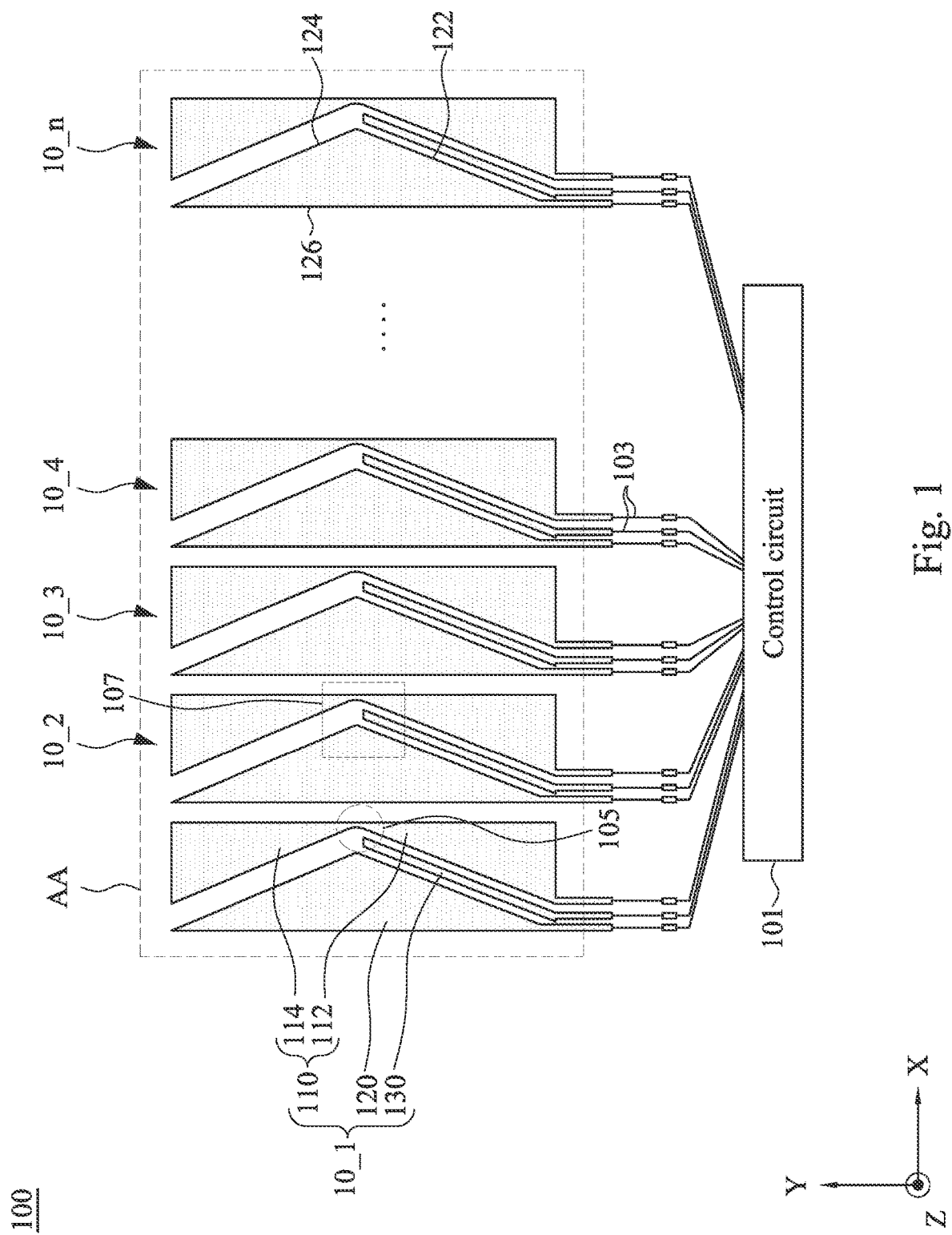
FIG. 1 is a simplified function block diagram of an electronic device according to one embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

FIG. 1 is a simplified function block diagram of an electronic device 100 according to one embodiment of the present disclosure. The electronic device 100 is suitable for self-capacitive touch sensing and comprises a control circuit 101, a plurality of wires 103, and a plurality of touch structures 10_1-10_n arranged along an X-axis. Capacitance of each of the touch structures 10_1-10_n varies based on a touch input, in which the touch input may be a finger of a user touching or approaching the electronic device 100. Capacitance variations of the touch structures 10_1-10_n are transmitted to the control circuit 101 via the wires 103, and the control circuit 101 is configured to calculate locations, on the X-axis and a Y-axis, of the touch input according to the received capacitance variations, in which the X-axis is substantially perpendicular to the Y-axis.

In some embodiments, the electronic device 100 further comprises various components for realizing a display function, such as one or more of glass substrates, a backlight module, and pixel circuits. For the sake of brevity, these components of the electronic device 100 are not shown in FIG. 1. The touch structures 10_1-10_n are disposed in an active area AA, configured to display pictures, of the electronic device 100, and the touch structures 10_1-10_n partially extend to outside of the active area AA to be coupled with the control circuit 101 through the wires 103, but this disclosure is not limited thereto. In some embodiments, the touch structures 10_1-10_n are totally inside the active area AA, and the wires 103 extend into the active area AA to be coupled with the touch structures 10_1-10_n.

In practice, the control circuit 101 may be implemented by a general touch sensing chip or by a touch and display driver integration (TDDI). The touch structures 10_1-10_n may be implemented by various suitable transparent conductive films, such as indium tin oxide (ITO) films or Al-doped ZnO (AZO) films.

As shown in FIG. 1, each of the touch structures 10_1-10_n comprises a first electrode 110, a second electrode 120, and a third electrode 130. The first electrode 110 comprises a bottom-half electrode 112 and an upper-half electrode 114 coupled with each other, in which the bottom-half electrode 112 and the upper-half electrode 114 extend toward each other along the Y-axis and are both substantially triangular. In some embodiments, a width of the bottom-half electrode 112 gradually narrows along a direction toward the upper-half electrode 114, and a width of the upper-half electrode 114 gradually narrows along a direction toward the bottom-half electrode 112. That is, the bottom-half electrode 112 and the upper-half electrode 114 are, in an electrical connection area 105, coupled with each other with respective vertices. In some embodiments, the bottom-half electrode 112 and the upper-half electrode 114 are right triangles.

The second electrode 120 is substantially triangular and comprises a first side 122, a second side 124, and a third side 126. The first side 122 and the second side 124 of the second electrode 120 face the bottom-half electrode 112 and the upper-half electrode 114, respectively. In some embodiments, a width of the second electrode 120 gradually narrows along a direction toward the electrical connection area 105. That is, one of the vertices of the second electrode 120 points toward the electrical connection area 105. In some embodiments, the first electrode 110 and the second electrode 120 are arranged so as to substantially form a rectangle. That is, the first electrode 110 and the second electrode 120 have shapes that can fit each other, in which the second electrode 120 is an obtuse triangle.

As shown in FIG. 1, the first electrode 110 and the second electrode 120 have no direct connection, and a V-shaped slit exists between the first electrode 110 and the second electrode 120. The third electrode 130 is disposed in the V-shaped slit. In some embodiments, the third electrode 130 is substantially strip-shaped and is disposed between the bottom-half electrode 112 and the first side 122 of the second electrode 120. In some embodiments, a length obtained by projecting the third electrode 130 to the Y-axis is substantially equal to a length obtained by projecting the bottom-half electrode 112 to the Y-axis. Taking the touch structure 10_1 as an example, the third electrode 130 thereof extends from a side, along the X-axis, of the touch structure 10_1 to the electrical connection area 105 along the V-shaped slit.

The third electrode 130 may enter the electrical connection area 105 but may not extend beyond the electrical connection area 105. The third electrodes 130 of the touch structures 10_2-10_n have similar configurations. For the sake of brevity, those descriptions will not be repeated here. In addition, the third electrode 130 has no direct connection with the first electrode 110 and the second electrode 120.

In the embodiment of FIG. 1, two adjacent touch structures of the touch structures 10_1-10_n are adjacent to each other by the respective first electrode 110 and second electrode 120. For example, referring to touch structures 10_1 and 10_2, the bottom-half electrode 112 and the upper-half electrode 114 of the touch structure 10_1 are adjacent to the third side 126 of the second electrode 120 (e.g., the longest side of the second electrode 120) of the touch structure 10_2. As another example, referring to touch structures 10_2 and 10_3, the bottom-half electrode 112 and the upper-half electrode 114 of the touch structure 10_2 are adjacent to the third side 126 of the second electrode 120 of the touch structure 10_3, and so on. For ease of understanding, each of the first electrode 110, the second electrode 120, and the third electrode 130 of FIG. 1 is depicted as coupled with one wire 103, but this disclosure is not limited thereto. In some embodiments, for increasing reliability and reducing impedance, each of the first electrode 110, the second electrode 120, and the third electrode 130 can be coupled with two or more wires 103.

Figure 2:
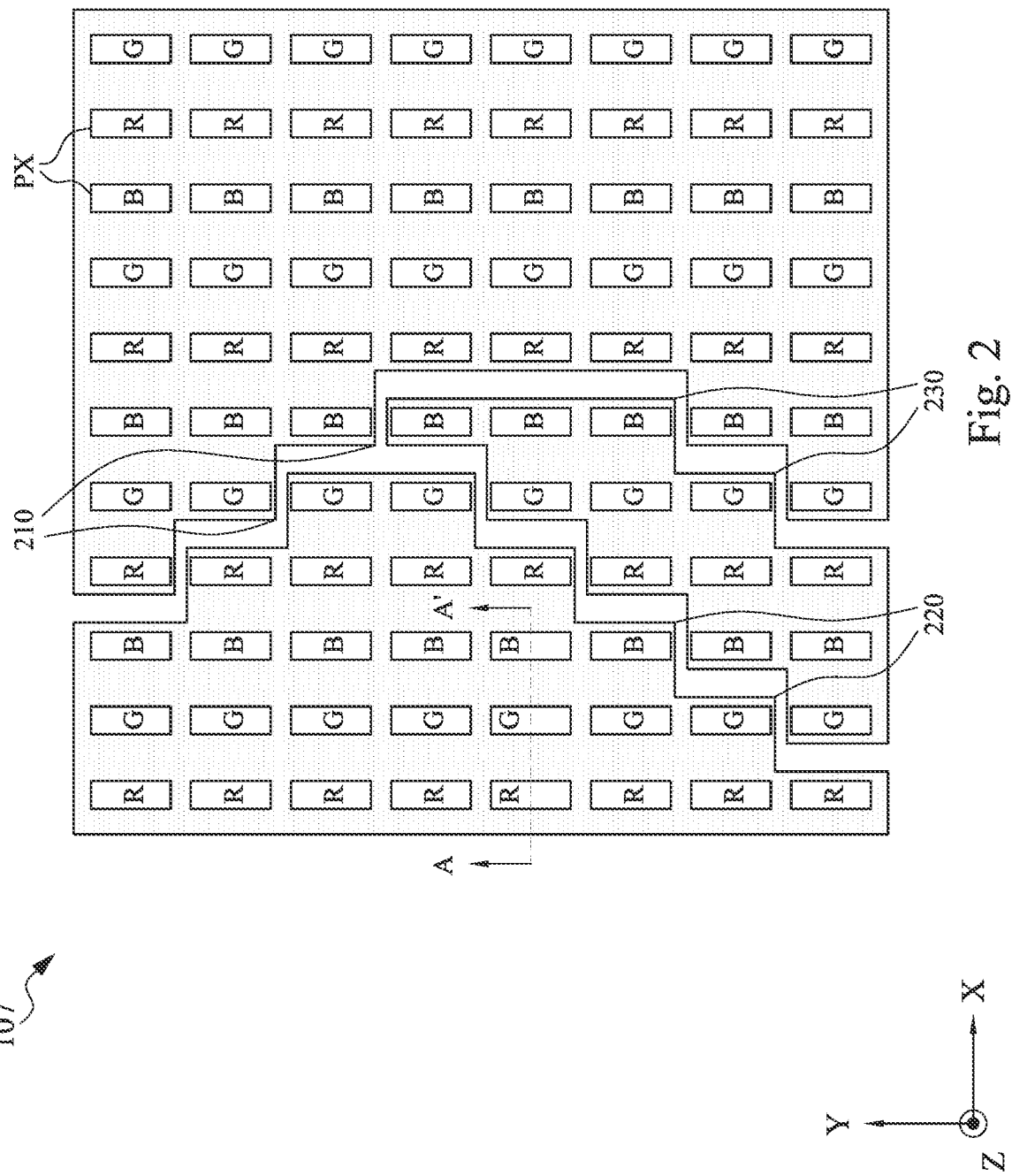
FIG. 2 is an enlarged schematic diagram of a region 107 of FIG. 1.

FIG. 2 is an enlarged schematic diagram of a region 107 of FIG. 1. In some embodiments, the first electrode 110, the second electrode 120, and the third electrode 130 are configured to provide voltages for operating corresponding ones of the pixel circuits PX of the electronic device 100. Therefore, at least one side of the first electrode 110, at least one side of the second electrode 120, and at least one side of the third electrode 130 are saw-tooth-shaped, so that these sides correspond to projections of multiple pixel circuits PX. The symbols R, G, and B in the blocks of the pixel circuits PX of FIG. 2 respectively mean that the pixel circuits PX are configured to emit red light, green light, and blue light. The arrangements and combinations of colors of pixel circuits PX in this disclosure, however, are not limited thereto.

Specifically, on a plane in which the X-axis and the Y-axis are located, at least one side of the first electrode 110 comprises a plurality of first protrusions 210, at least one side of the second electrode 120 comprises a plurality of second protrusions 220, and at least one side of the third electrode 130 comprises a plurality of third protrusion 230. Each of the first protrusions 210, the second protrusions 220, and the third protrusions 230 overlaps with projections projected by a corresponding one or more pixel circuits PX along a Z-axis, in which the Z-axis is substantially perpendicular to the X-axis and the Y-axis.

In addition, in some embodiments, slits between any two of the first electrode 110, the second electrode 120, and the third electrode 130 do not overlap with projections projected by the pixel circuits PX along the Z-axis.

Figure 3:
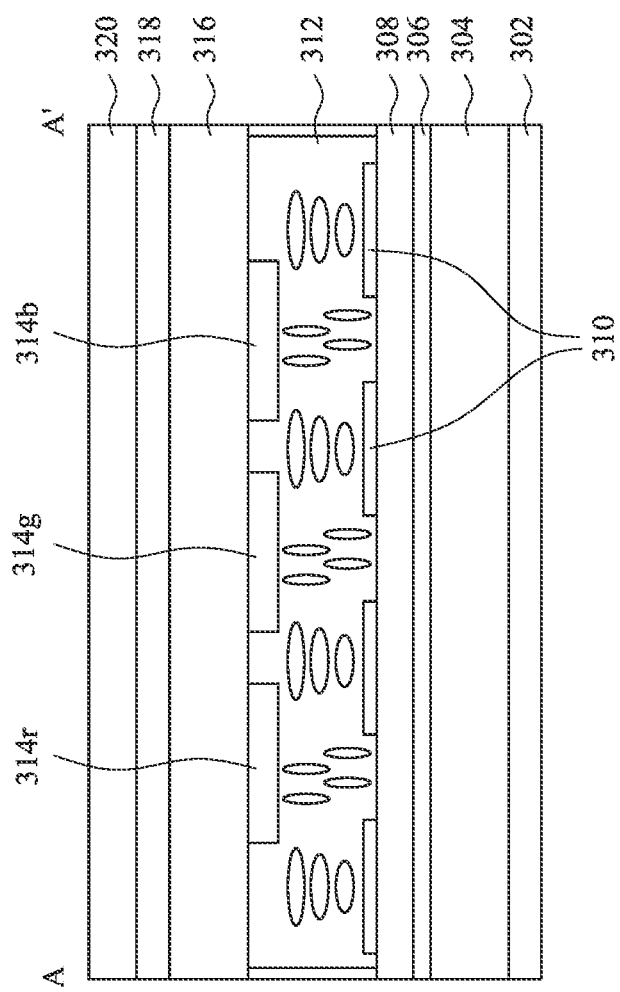
FIG. 3 is a simplified cross-section diagram along line A-A' of FIG. 2 according to one embodiment of the present disclosure.

FIG. 3 is a simplified cross-section diagram along line A-A' of FIG. 2 according to one embodiment of the present disclosure. In this embodiment, the pixel circuits PX are implemented by liquid crystal pixel circuits. The electronic device 100 comprises, from the bottom to the top, a first polarization layer 302, a bottom glass substrate 304, a transparent conductive layer 306, an isolation layer 308, a thin-film transistor layer 310, a liquid crystal layer 312, a plurality of color filters 314r, 314g, and 314b, an upper glass substrate 316, a second polarization layer 318, and a cover glass 320. The touch structures 10-_2-10_n of FIG. 1 may be disposed in the transparent conductive layer 306 and are configured to provide a common voltage for each pixel circuit PX. In technologies of liquid crystal displays, the common voltage may be used to realize polarity inversion driving methods and to stabilize cross voltages of liquid crystal capacitors. The use of the common voltage is well-known for one of ordinary skilled in the art. For the sake of brevity, those descriptions will not be repeated here.

Figure 4:
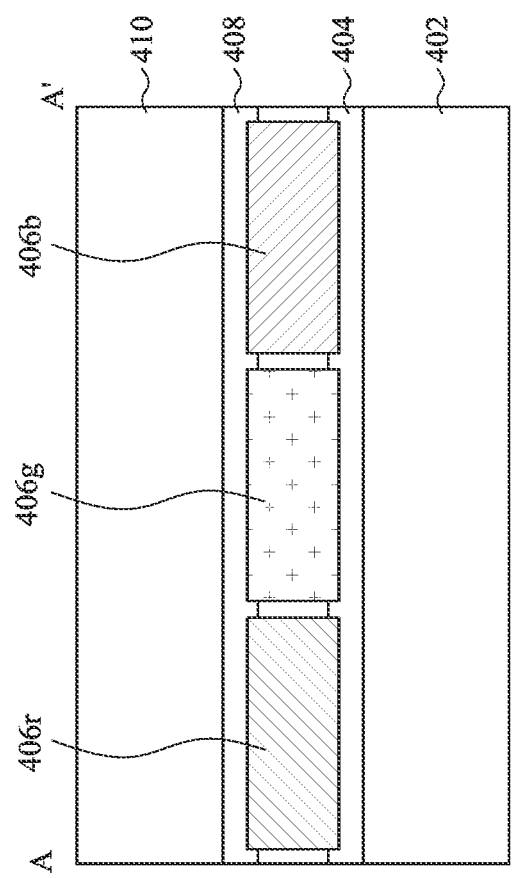
FIG. 4 is a cross-section diagram along line A-A' of FIG. 2 according to another embodiment of the present disclosure.

FIG. 4 is a cross-section diagram along line A-A' of FIG. 2 according to another embodiment of the present disclosure. In this embodiment, the pixel circuits PX are implemented by organic light-emitting diode (OLED) pixel circuits. The electronic device 100 comprises, from the bottom to the top, a bottom substrate 402, a metal conductive layer 404, a plurality of organic light-emitting layers 406r, 406g, and 406b, a transparent conductive layer 408, and a top substrate 410. The touch structures 10_2-10_n of FIG. 1 may be disposed in the transparent conductive layer 408 and may be coupled with cathodes of the organic light-emitting layers 406r, 406g, and 406b. In some embodiments, the metal conductive layer 404 and the transparent conductive layer 408 may be swapped with each other, and thus the touch structures 10_2-10_n of FIG. 1 are coupled with anodes of the organic light-emitting layers 406r, 406g, and 406b.

Figure 5:
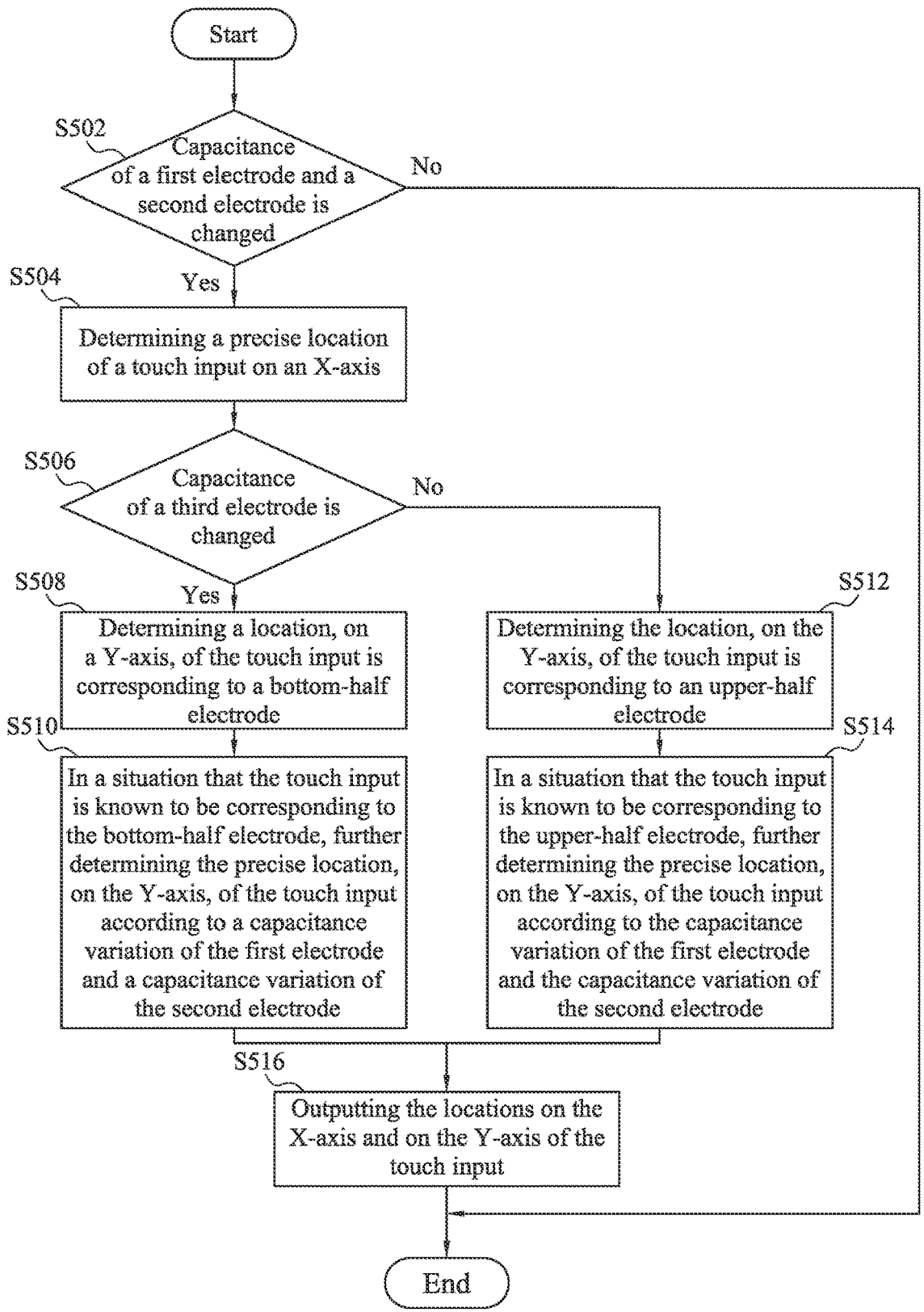
FIG. 5 is a flowchart of a touch sensing method according to one embodiment of the present disclosure.

FIG. 5 is a flowchart of a touch sensing method 500 according to one embodiment of the present disclosure. The electronic device 100 (or the control circuit 101) of FIG. 1 may be configured to perform the touch sensing method 500, so as to calculate a precise location in which the touch input is on the electronic device 100. In operation S502, the control circuit 101 determines if capacitance of the first electrode 110 and capacitance of the second electrode 120 of one of the touch structures 10_1-10_n have variations. If so, the control circuit 101 then conducts operation S504. If not, the control circuit 101 may finish the touch sensing method 500 or may repeatedly conduct operation S502. For ease of understanding, one of the touch structures 10_1-10_n, whose first electrode 110 and second electrode 120 have capacitance variations, is hereinafter referred to as a "target touch structure 10."

In operation S504, the control circuit 101 determines a location, on the X-axis, of the target touch structure 10 as a location, on the X-axis, of the touch input. Then, in operation S506, the control circuit 101 determines if capacitance of the third electrode 130 of the target touch structure 10 has variations. If so, the control circuit 101 then conducts operations S508-S510. If not, the control circuit 101 then conducts operations S512-S514.

Figures 6A, 6B:
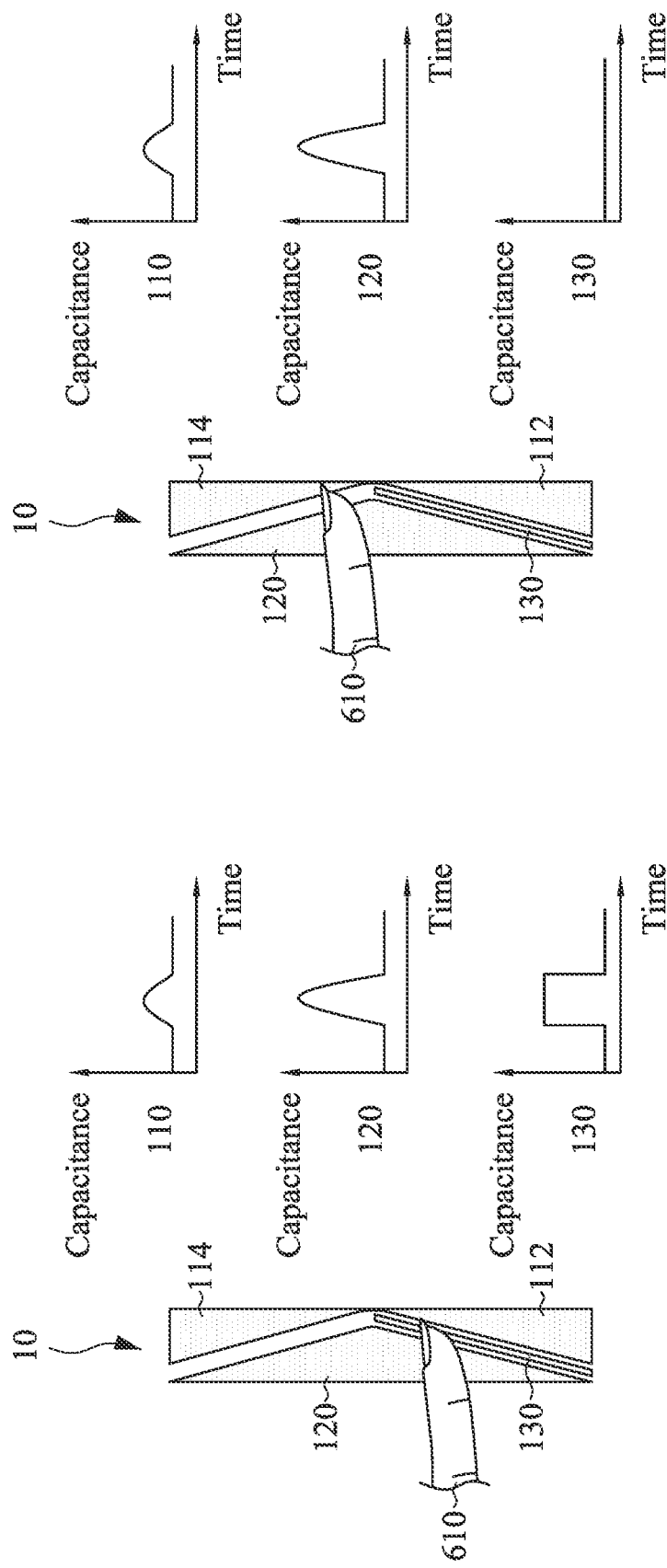
FIG. 6A is a schematic diagram for illustrating capacitance variations of different parts of a touch structure caused by touch input.
FIG. 6B is another schematic diagram for illustrating capacitance variations of different parts of the touch structure caused by the touch input.

Reference is made to FIG. 5 and FIG. 6A. In operation S508, since the capacitance of the third electrode 130 varies, the control circuit 101 determines that the touch input (e.g., the finger 610 of the user) has the location corresponding to the bottom-half electrode 112. In operation S510, in a situation in which the touch input is known to be corresponding to the bottom-half electrode 112, the control circuit 101 further determines a precise location, on the Y-axis, of the touch input according to a relationship between a capacitance variation of the first electrode 110 and a capacitance variation of the second electrode 120.

For instance, as shown in FIG. 6A, the capacitance variation of the first electrode 110 is smaller than the capacitance variation of the second electrode 120 and the capacitance of the third electrode 130 varies, and thus control circuit 101 knows that the touch input has a smaller area corresponding to the first electrode 110 and has a larger area corresponding to the second electrode 120, and also knows that the touch input has the location corresponding to the bottom-half electrode 112. As a result, the control circuit 101 determines that the touch input is at a lower middle of the target touch structure 10.

Similarly, reference is made to FIG. 5 and FIG. 6B. In operation S512, the capacitance of the third electrode 130 remains unchanged, and thus the control circuit 101 determines that the touch input (e.g., the finger 610 of the user) has the location corresponding to the upper-half electrode 114. In operation S514, in a situation in which the touch input is known to be corresponding to the upper-half electrode 114, the control circuit 101 further determines the precise location, on the Y-axis, of the touch input according to the relationship between the capacitance variation of the first electrode 110 and the capacitance variation of the second electrode 120.

For example, as shown in FIG. 6B, the capacitance variation of the first electrode 110 is smaller than the capacitance variation of the second electrode 120 and the capacitance of the third electrode 130 remains unchanged, and thus the control circuit 101 knows that the touch input has a smaller area corresponding to the first electrode 110 and has a larger area corresponding to the second electrode 120, and also knows that the touch input has the location corresponding to the upper-half electrode 114. As a result, the control circuit 101 determines that the touch input is at an upper middle of the target touch structure 10.

The control circuit 101 conducts operation S516 after operation S510 or S514 is finished, so as to output the precise locations, on the X-axis and on the Y-axis (i.e., on the electronic device 100), of the touch input. After operation S516 is finished, the control circuit 101 may finish the touch sensing method 500 or may conduct aforesaid operation S502 again.

As can be appreciated from the foregoing descriptions, compared with a conventional touch structure formed by only two triangular electrodes, the third electrode 130 of the above embodiments enables the control circuit 101 to know in advance that the touch input is at the upper half or the bottom half of the target touch structure 10, so that the calculation area of the control circuit 101 reduces by almost one-half. Therefore, the electronic device 100 can reach, by analog-to-digital converters (ADCs) with the same resolution, more than twice the precision of conventional touch devices.

Figure 7:
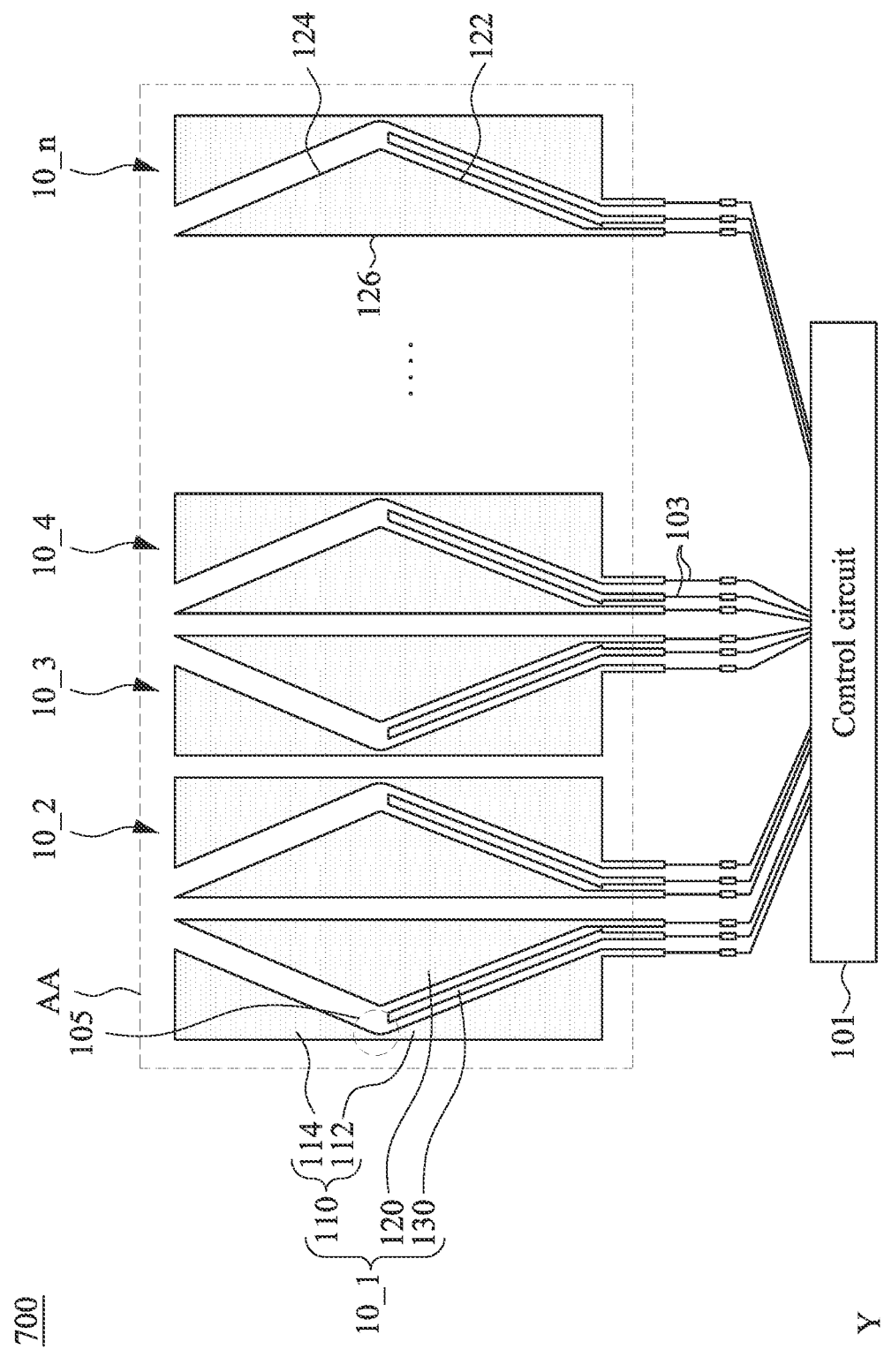
FIG. 7 is a simplified functional block diagram of an electronic device according to one embodiment of the present disclosure.

FIG. 7 is a simplified functional block diagram of an electronic device 700 according to one embodiment of the present disclosure. The electronic device 700 is similar to the electronic device 100, and the difference is that the touch structures 10_2-10_n of the electronic device 700 have arrangements different from that of the electronic device 100. Specifically, in the electronic device 700, two adjacent touch structures of the touch structures 10_1-10_n are adjacent to each other by the respective first electrodes 110 or by the respective second electrodes 120. For example, the third sides 126 of the second electrodes 120 of the touch structures 10_1 and 10_2 are adjacent to each other. As another example, the first electrodes 110 of the touch structures 10_2 and 10_3 are adjacent to each other.

The foregoing descriptions regarding other corresponding implementations, connections, operations, and related advantages of the electronic device 100 are also applicable to the electronic device 700. For the sake of brevity, those descriptions will not be repeated here. In addition, the electronic device 700 may be configured to perform the touch sensing method 500.

Figure 8:
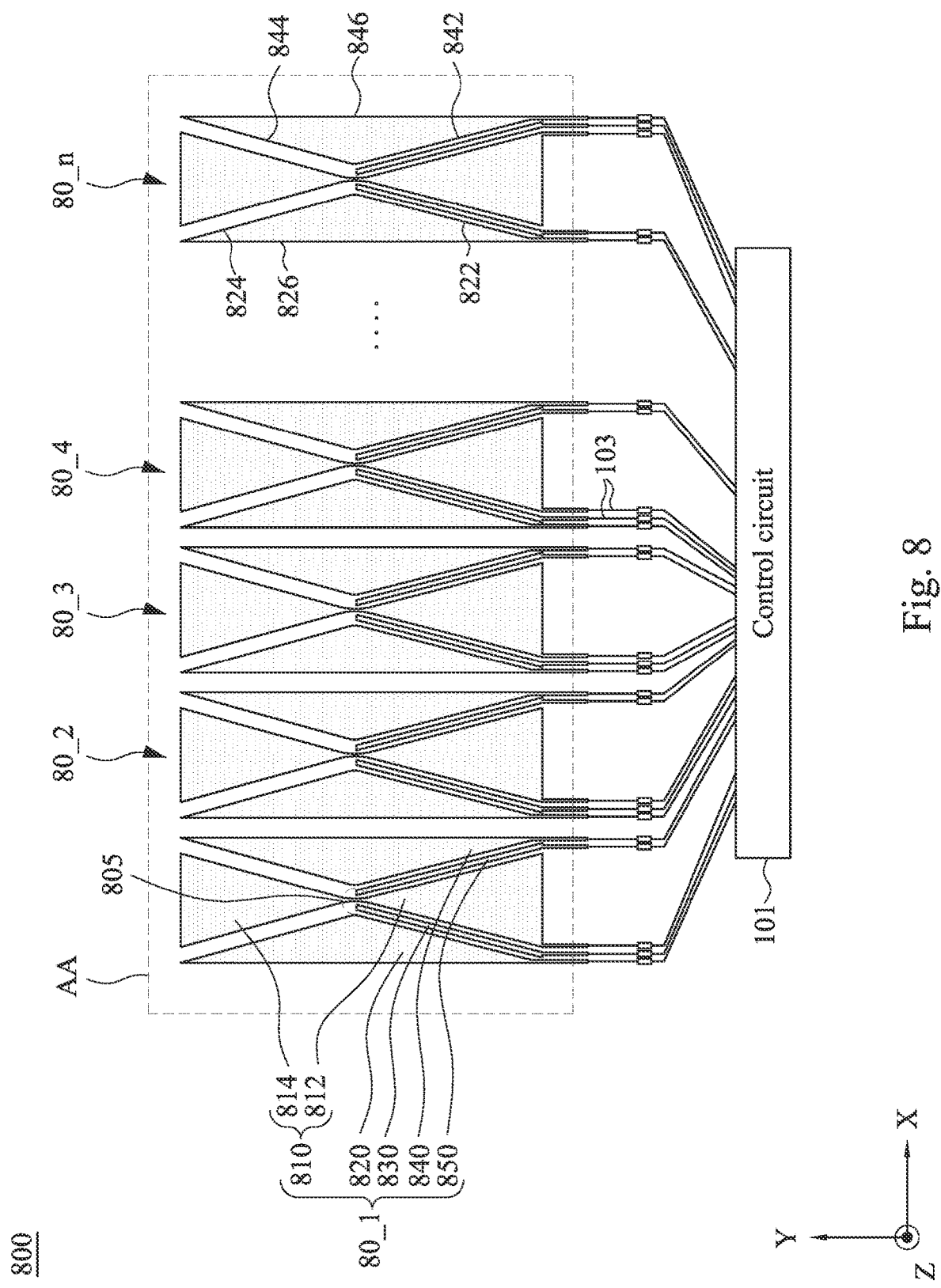
FIG. 8 is a simplified functional block diagram of an electronic device according to one embodiment of the present disclosure.

FIG. 8 is a simplified functional block diagram of an electronic device 800 according to one embodiment of the present disclosure. The electronic device 800 is suitable for self-capacitive touch sensing and comprises a control circuit 101, a plurality of wires 103, and a plurality of touch structures 80_1-80_n arranged along the X-axis. Each of the touch structures 80_1-80_n comprises a first electrode 810, a second electrode 820, a third electrode 830, a fourth electrode 840, and a fifth electrode 850. The first electrode 810 comprises a bottom-half electrode 812 and an upper-half electrode 814 coupled with each other, in which the bottom-half electrode 812 and the upper-half electrode 814 extend toward to each other along the Y-axis and are substantially triangular. In some embodiments, a width of the bottom-half electrode 812 gradually narrows along a direction toward the upper-half electrode 814, and a width of the upper-half electrode 814 gradually narrows along a direction toward the bottom-half electrode 812. That is, the bottom-half electrode 812 and the upper-half electrode 814 are coupled with each other in an electrical connection area 805 by respective vertices. In some embodiments, the bottom-half electrode 112 and the upper-half electrode 114 are acute triangles.

The second electrode 820 is substantially triangular and comprises a first side 822, a second side 824, and a third side 826. The first side 822 and the second side 824 of the second electrode 820 face the bottom-half electrode 812 and the upper-half electrode 814, respectively. In some embodiments, a width of the second electrode 820 gradually narrows along a direction toward the electrical connection area 805. That is, one of the vertices of the second electrode 820 points toward the electrical connection area 805.

As shown in FIG. 8, the first electrode 810 and the second electrode 820 have no direct connection, and a V-shaped slit exists between the first electrode 810 and the second electrode 820. The third electrode 830 is disposed in the V-shaped slit between the first electrode 810 and the second electrode 820. In some embodiments, the third electrode 830 is substantially strip-shaped and is disposed between the bottom-half electrode 812 and the first side 822 of the second electrode 820. In some embodiments, a length obtained by projecting the third electrode 830 to the Y-axis is substantially equal to a length obtained by projecting the bottom-half electrode 812 to the Y-axis. Taking the touch structure 80_1 as an example, the third electrode 830 thereof extends from a side, along the X-axis, of the touch structure 80_1 to the electrical connection area 805 along the V-shaped slit between the first electrode 810 and the second electrode 820. The third electrode 830 may enter the electrical connection area 805 but may not extend beyond the electrical connection area 805. The third electrodes 830 of the touch structures 80_2-80_n have similar configurations. For the sake of brevity, those descriptions will not be repeated here. In addition, the third electrode 830 has no direct connection with the first electrode 810 and the second electrode 820.

The fourth electrode 840 is substantially triangular and comprises a first side 842, a second side 844, and a third side 846. The first side 842 and the second side 844 of the fourth electrode 840 face the bottom-half electrode 812 and the upper-half electrode 814, respectively. In some embodiments, a width of the fourth electrode 840 gradually narrows along a direction toward the electrical connection area 805. That is, one of the vertices of the fourth electrode 840 points toward the electrical connection area 805. In this embodiment, the first electrode 810 is disposed between the second electrode 820 and the fourth electrode 840. In some embodiments, the first electrode 810, the second electrode 820, and the fourth electrode 840 are arranged so as to substantially form a rectangle. That is, the second electrode 820 and the fourth electrode 840 are axisymmetric, with the first electrode 810 as the center of symmetry. In some embodiments, the second electrode 820 and the fourth electrode 840 are obtuse triangles.

As shown in FIG. 8, the first electrode 810 and the fourth electrode 840 have no direct connection, and a V-shaped slit exists between the first electrode 810 and the fourth electrode 840. The fifth electrode 850 is disposed in the V-shaped slit between the first electrode 810 and the fourth electrode 840. In some embodiments, the fifth electrode 850 is substantially strip-shaped and is disposed between the bottom-half electrode 812 and the first side 842 of the fourth electrode 840. In some embodiments, a length obtained by projecting the fifth electrode 850 to the Y-axis is substantially equal to a length obtained by projecting the bottom-half electrode 812 to the Y-axis. Taking the touch structure 80_1 as an example, the fifth electrode 850 thereof extends from a side, on the X-axis, of the touch structure 80_1 to the electrical connection area 805 along the V-shaped slit between the first electrode 810 and the fourth electrode 840. The fifth electrode 850 may enter the electrical connection area 805 but may not extend beyond the electrical connection area 805. The fifth electrodes 850 of the touch structures 80_2-80_n have similar configurations. For the sake of brevity, those descriptions will not be repeated here. In addition, the fifth electrode 850 has no direct connection with the first electrode 810 and the fourth electrode 840.

In the embodiment of FIG. 8, two adjacent touch structures of the touch structures 80_1-80_n are adjacent to each other by respective second electrode 820 and fourth electrode 840. For example, taking the touch structures 80_1 and 80_2 as an example, the third side 846 of the fourth electrode 840 of the touch structure 80_1 is adjacent to the third side 826 of the second electrode 820 of the touch structure 80_2. As another example, taking the touch structures 80_2 and 80_3 as an example, the third side 846 of the fourth electrode 840 of the touch structure 80_2 is adjacent to the third side 826 of the second electrode 820 of the touch structure 80_3, and so on.

For ease of understanding, each of the first electrode 810, the second electrode 820, the third electrode 830, the fourth electrode 840, and the fifth electrode 850 is depicted as coupled with one wire 103, but this disclosure is not limited thereto. In some embodiments, for increasing reliability and reducing impedance, each of the first electrode 810, the second electrode 820, the third electrode 830, the fourth electrode 840, and the fifth electrode 850 can be coupled with two or more wires 103.

The foregoing descriptions regarding other corresponding implementations, connections, operations, and related advantages of the electronic device 100 are also applicable to the electronic device 800. For the sake of brevity, those descriptions will not be repeated here. For instance, the first electrode 810, the second electrode 820, the third electrode 830, the fourth electrode 840, and the fifth electrode 850 each may have at least one saw-tooth-shaped side, so as to overlap with multiple corresponding pixel circuits PX of the electronic device 800 and to provide voltages for operating these pixel circuits PX. For example, if the pixel circuits PX are implemented by the liquid crystal pixel circuits, the aforementioned first electrode 810 through fifth electrode 850 are configured to provide the common voltage. As another example, if the pixel circuits PX is implemented by the OLED pixel circuits, the aforementioned first electrode 810 through fifth electrode 850 are configured to provide a system high voltage (VDD) or a system low voltage (VSS).

That is, the first electrode 810, the second electrode 820, the third electrode 830, the fourth electrode 840, and the fifth electrode 850 each have at least one side comprising a plurality of protrusions. Each of these protrusions overlaps with projections projected by one or more corresponding pixel circuits PX along the Z-axis. In some embodiments, slits between any two of the first electrode 810, the second electrode 820, the third electrode 830, the fourth electrode 840, and the fifth electrode 850 do not overlap with projections projected by the pixel circuits PX along the Z-axis.

Figure 9:
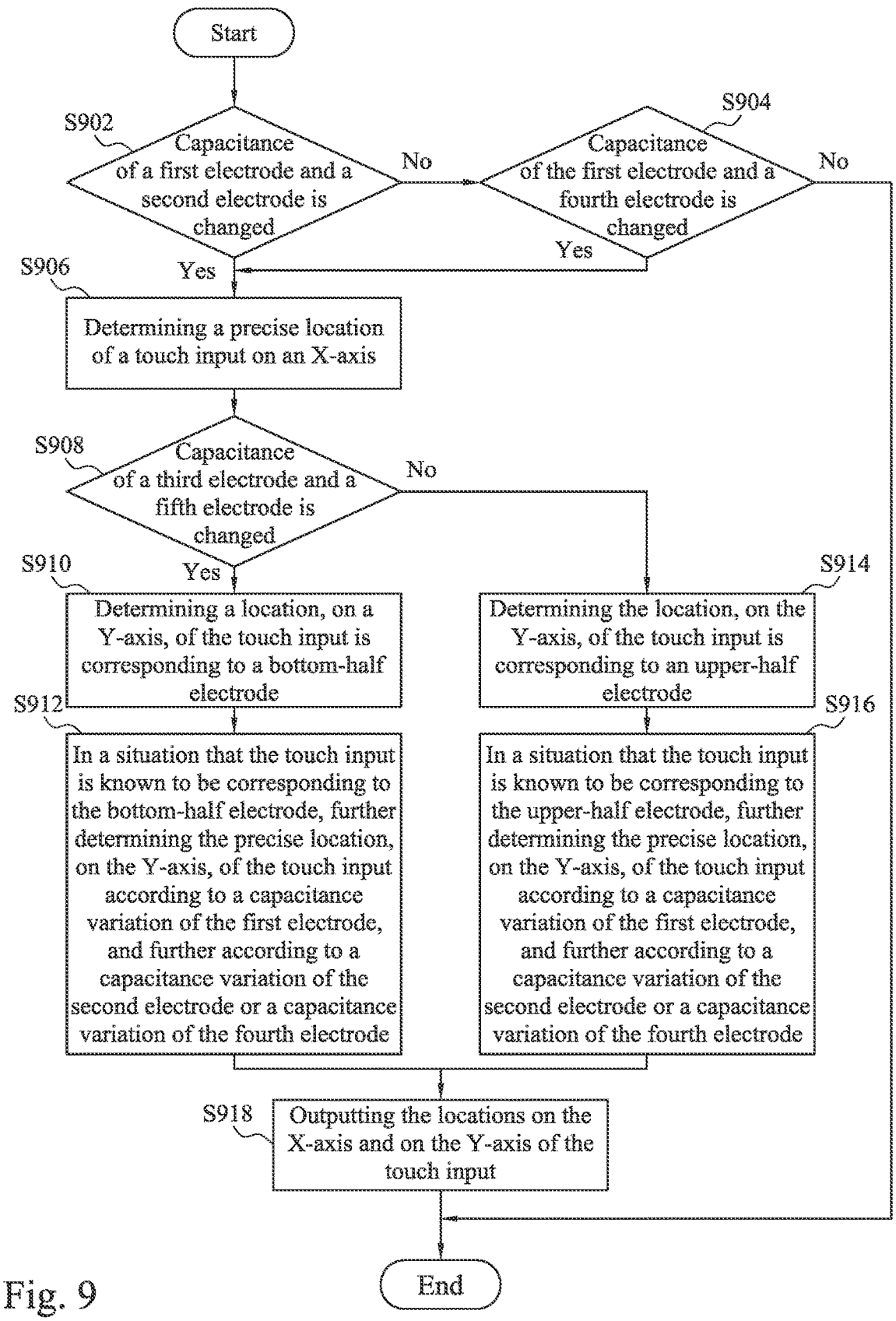
FIG. 9 is a flowchart of a touch sensing method according to one embodiment of the present disclosure.

FIG. 9 is a flowchart of a touch sensing method 900 according to one embodiment of the present disclosure. The electronic device 800 (or the control circuit 101) may be configured to conduct the touch sensing method 900 to calculate the precise location of the touch input on the electronic device 800. In operation S902, the control circuit 101 determines if capacitance of the first electrode 810 and capacitance of the second electrode 820 of one of the touch structures 80_1-80_n have variations. If not, the control circuit 101 then conducts operation S904. If so, the control circuit 101 the conducts operation S906.

In operation S904, the control circuit 101 determines if the capacitance of the first electrode 810 and capacitance of the fourth electrode 840 of one of the touch structures 80_1-80_n have variations. If so, the control circuit 101 conducts operation S906. If not, the control circuit 101 may finish the touch sensing method 900 or may conduct operation S902 again. For ease of understanding, one of the touch structures 80_1-80_n, whose first electrode 810 and second electrode 820 have capacitance variations or first electrode 810 and fourth electrode 840 have capacitance variations, is hereinafter referred to as a "target touch structure 80."

In operation S906, the control circuit 101 determines a location, on the X-axis, of the target touch structure 80 as a location, on the X-axis, of the touch input. In operation S908, the control circuit 101 determines if capacitance of the third electrode 830 or capacitance of the fifth electrode 850 of the target touch structure 80 has variations. If so, the control circuit 101 then conducts operations S910-S912. If not, the control circuit 101 then conducts operations S914-S916.

In operation S910, the capacitance of the third electrode 830 or the capacitance of the fifth electrode 850 has variations, and thus the control circuit 101 determines that the touch input has the location corresponding to the bottom-half electrode 812. In operation S912, in a situation in which the touch input is known to be corresponding to bottom-half electrode 812, the control circuit 101 further determines a precise location, on the Y-axis, of the touch input according to a relationship between a capacitance variation of the first electrode 810 and a capacitance variation of the second electrode 820 or according to a relationship between the capacitance variation of the first electrode 810 and a capacitance variation of the fourth electrode 840. The specific determination method is similar to that described above with respect to FIG. 6A. For the sake of brevity, those descriptions will not be repeated here.

Similarly, in operation S914, the capacitance of the third electrode 830 or the capacitance of the fifth electrode 850 remains unchanged, and thus the control circuit 101 determines that the touch input has the location corresponding to the upper-half electrode 814. In operation S916, in a situation in which the touch input is known to be corresponding to the upper-half electrode 814, the control circuit 101 further determines the precise location, on the Y-axis, of the touch input according to the relationship between the capacitance variation of the first electrode 110 and the capacitance variation of the second electrode 120 or according to the relationship between the capacitance variation of the first electrode 810 and the capacitance variation of the fourth electrode 840. The specific determination method is similar to that described above with respect to FIG. 6B. For the sake of brevity, those descriptions will not be repeated here.

The control circuit 101 conducts operation S918 after operation S912 or S916 is finished, so as to output the precise locations, on the X-axis and on the Y-axis (i.e., on the electronic device 800), of the touch input. After operation S918 is finished, the control circuit 101 may finish the touch sensing method 900 or may conduct aforesaid operation S902 again.

As can be appreciated from the foregoing descriptions, compared with the conventional touch structure formed by only two triangular electrodes, the third electrode 830 and fifth electrode 850 of the above embodiments enable the control circuit 101 to know in advance that the touch input is at the upper half or the bottom half of the target touch structure 80, so that the calculation area of the control circuit 101 reduces by almost one-half. Therefore, the electronic device 800 can reach, by ADCs with the same resolution, more than twice the precision of conventional touch devices.

In addition, as can be known from the embodiments of the present disclosure, compared with a conventional, in-cell touch display having a plurality of matrix-arranged rectangular touch electrodes, the electronic devices 100, 700, and 800 significantly reduce a number of wires 103 between the touch electrodes and the control circuit 101. As a result, the chip design is simplified, and the product reliability is increased because of the risk of short-circuit between the touch electrodes is reduced.

In addition, the touch electrodes in the electronic devices 100, 700, and 800 need not comprise via holes to be coupled with the wires 103, helping to reduce manufacture processes and to increase production yield.

In some embodiments, the electronic devices 100, 700, and 800 may be smart phones, tablets, or notebook computers, or may be in-cell touch displays disposed in these devices.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The term "couple" is intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The size and relative sizes of some of the elements shown in drawings may be enlarged, or the shapes of some of the elements may be simplified so that the contents of the embodiments can be more clearly expressed. Therefore, the shapes, sizes, relative sizes, and relative positions of the various elements in the drawings are merely illustrative and should not be used to limit the scope of the claims of the present disclosure. In addition, the present disclosure may be embodied in many different forms, and the explanation of the present disclosure should not be limited to the embodiments provided by the present disclosure.

In addition, the singular forms "a," "an," and "the" herein are intended to comprise the plural forms as well, unless the context clearly indicates otherwise.

Other embodiments of the present disclosure will be apparent to those skilled in the art from consideration of the specification and practice of the present disclosure disclosed herein. It is intended that the specification and examples be considered as exemplary only, with a true scope and spirit of the present disclosure being indicated by the following claims.

What is claimed is:

1. An electronic device with touch sensing function, comprising a plurality of touch structures arranged along an X-axis, wherein each touch structure of the plurality of touch structures comprises: a first electrode, comprising an upper-haft electrode and a bottom-haft electrode coupled with each other, wherein the upper-half electrode and the bottom-haft electrode extend toward each other along a Y-axis and are both substantially triangular, and the X-axis is substantially perpendicular to the Y-axis; a second electrode, wherein the second electrode is substantially triangular, and a first side and a second side of the second electrode face the bottom-half electrode and the upper-half electrode, respectively; a third electrode disposed between the bottom-half electrode and the first side of the second electrode, wherein the third electrode is substantially strip-shaped; and wherein when a touch input changes capacitance of the first electrode, capacitance of the second electrode, and capacitance of the third electrode, the electronic device determines that a location, on the Y-axis, of the touch input corresponds to the bottom-half electrode, and when the touch input changes the capacitance of the first electrode and the capacitance of the second electrode without changing the capacitance of the third electrode, the electronic device determines that the location, on the Y-axis of the touch input corresponds to the upper-half electrode.

2. The electronic device of claim 1, wherein a length obtained by projecting the third electrode to the Y-axis is substantially equal to a length obtained by projecting the bottom-half electrode to the Y-axis.

3. The electronic device of claim 1, wherein the upper-half electrode gradually narrows along a direction toward the bottom-half electrode, and the bottom-half electrode gradually narrows along a direction toward the upper-half electrode.

4. The electronic device of claim 1, wherein the second electrode gradually narrows along a direction toward an electrical connection area of the upper-half electrode and the bottom-half electrode.

5. The electronic device of claim 1, wherein the second electrode and the first electrode are arranged so as to substantially form a rectangle.

6. The electronic device of claim 1, wherein among a first touch structure and a second touch structure, adjacent to each other, of the plurality of touch structures, the upper-half electrode and the bottom-half electrode of the first touch structure are adjacent to a third side of the second electrode of the second touch structure.

7. The electronic device of claim 1, wherein among a first touch structure and a second touch structure, adjacent to each other, of the plurality of touch structures, a third side of the second electrode of the first touch structure is adjacent to a third side of the second electrode of the second touch structure.

8. The electronic device of claim 7, wherein among the second touch structure and a third touch structure, adjacent to each other, of the plurality of touch structures, the first electrode of the second touch structure and the first electrode of the third touch structure are adjacent to each other.

9. The electronic device of claim 1, further comprising a plurality of pixel circuits, wherein at least one side of the first electrode, at least one side of the second electrode, and at least one side of the third electrode are saw-tooth-shaped so that the first electrode, the second electrode, and the third electrode correspond to projections of corresponding ones of the plurality of pixel circuits.

10. The electronic device of claim 9, wherein the at least one side of the first electrode comprises a plurality of first protrusions, the at least one side of the second electrode comprises a plurality of second protrusions, and the at least one side of the third electrode comprises a plurality of third protrusions, each of the plurality of first protrusions, the plurality of second protrusions, and the plurality of third protrusions overlaps with projections projected by a corresponding one or more of the plurality of pixel circuits along a Z-axis, wherein the Z-axis is substantially perpendicular to the X-axis and the Y-axis.

11. The electronic device of claim 9, wherein when the plurality of pixel circuits are liquid crystal pixel circuits, the first electrode, the second electrode, and the third electrode are configured to provide a common voltage to the corresponding ones of the plurality of pixel circuits, and when the plurality of pixel circuits are organic light-emitting diode (OLED) pixel circuits, the first electrode, the second electrode, and the third electrode are coupled with cathodes or anodes of OLEDs of the corresponding ones of the plurality of pixel circuits.

12. The electronic device of claim 1, wherein each touch structure of the plurality of touch structures further comprises:

a fourth electrode, wherein the fourth electrode is substantially triangular, a first side and a second side of the fourth electrode face the bottom-half electrode and the upper-half electrode, respectively, and the first electrode is disposed between the second electrode and the fourth electrode; and a fifth electrode disposed between the bottom-half electrode and the first side of the fourth electrode, wherein the fifth electrode is substantially strip-shaped.

13. The electronic device of claim 12, wherein the first electrode, the second electrode, and the fourth electrode are arranged so as to substantially form a rectangle.

14. The electronic device of claim 12, wherein the fourth electrode gradually narrows along a direction toward an electrical connection area of the upper-half electrode and the bottom-half electrode.

15. The electronic device of claim 12, wherein among a first touch structure and a second touch structure, adjacent to each other, of the plurality of touch structures, a third side of the fourth electrode of the first touch structure is adjacent to a third side of the second electrode of the second touch structure.

16. The electronic device of claim 12, wherein when a touch input changes capacitance of the first electrode, capacitance of the fourth electrode, and capacitance of the fifth electrode, the electronic device determines that a location, on the Y-axis, of the touch input corresponds to the bottom-half electrode, and when the touch input changes the capacitance of the first electrode and the capacitance of the fourth electrode without changing the capacitance of the fifth electrode, the electronic device determines that the location, on the Y-axis, of the touch input corresponds to the upper-half electrode.

17. The electronic device of claim 12, further comprising a plurality of pixel circuits, wherein at least one side of the first electrode, at least one side of the second electrode, at least one side of the third electrode, at least one side of the fourth electrode, and at least one side of the fifth electrode are saw-tooth-shaped so that the first electrode, the second electrode, the third electrode, the fourth electrode, and the fifth electrode correspond to projections of corresponding ones of the plurality of pixel circuits.

18. The electronic device of claim 17, wherein the at least one side of the first electrode comprises a plurality of first protrusions, the at least one side of the second electrode comprises a plurality of second protrusions, the at least one side of the third electrode comprises a plurality of third protrusions, the at least one side of the fourth electrode comprises a plurality of fourth protrusions, and the at least one side of the fifth electrode comprises a plurality of fifth protrusions, each of the plurality of first protrusions, the plurality of second protrusions, the plurality of third protrusions, the plurality of fourth protrusions, and the plurality of fifth protrusions overlaps with projections projected by a corresponding one or more of the plurality of pixel circuits along a Z-axis, wherein the Z-axis is substantially perpendicular to the X-axis and Y-axis.

19. A touch sensing method, suitable for an electronic device with touch sensing function, wherein the electronic device comprises a plurality of touch structures arranged along an X-axis and configured to sense a touch input, and the touch sensing method comprises:

when capacitance of a first electrode and capacitance of a second electrode of one of the plurality of touch structures is changed, determining a location, on the X-axis, of the touch input according to a location, on the X-axis, of the one of the plurality of touch structures, wherein the first electrode comprises an upper-half electrode and a bottom-half electrode coupled with each other, the upper-half electrode and the bottom-half electrode extend toward each other along a Y-axis and are both substantially triangular, and the X-axis is substantially perpendicular to the Y-axis, wherein the second electrode is substantially triangular, and a first side and a second side of the second electrode face the bottom-half electrode and the upper-half electrode, respectively;

when capacitance of a third electrode of the one of the plurality of touch structures is changed, determining that a location, on the Y-axis, of the touch input corresponds to the bottom-half electrode, wherein the third electrode is disposed between the bottom-half electrode and the first side of the second electrode and is substantially strip-shaped;

when the capacitance of the third electrode remains unchanged, determining that the location, on the Y-axis, of the touch input corresponds to the upper-half electrode; and in a situation in which the location, on the Y-axis, of the touch input is known to be corresponding to the upper-half electrode or the bottom-half electrode, further determining the location, on the Y-axis, of the touch input according to a capacitance variation of the first electrode and a capacitance variation of the second electrode.

20. The touch sensing method of claim 19, further comprising:

when the capacitance of the first electrode and capacitance of a fourth electrode of the one of the plurality of touch structures is changed, determining the location, on the X-axis, of the touch input according to the location, on the X-axis, of the one of the plurality of touch structures, wherein the fourth electrode is substantially triangular, a first side and a second side of the fourth electrode face the bottom-half electrode and the upper-half electrode, respectively, and the first electrode is disposed between the second electrode and the fourth electrode;

when capacitance of a fifth electrode of the one of the plurality of touch structures is changed, determining that the location, on the Y-axis, of the touch input corresponds to the bottom-half electrode, wherein the fifth electrode is disposed between the bottom-half electrode and the first side of the fourth electrode and is substantially strip-shaped; and when the capacitance of the third electrode and the capacitance of the fifth electrode remain unchanged, determining that the location, on the Y-axis, of the touch input corresponds to the upper-half electrode;

wherein the location, on the Y-axis, of the touch input is determined according to the capacitance variation of the first electrode and the capacitance variation of the second electrode or according to the capacitance variation of the first electrode and a capacitance variation of the fourth electrode.

\* \* \* \* \*